United States Patent
Hatada et al.

(10) Patent No.: US 6,953,991 B2
(45) Date of Patent: Oct. 11, 2005

(54) SEMICONDUCTOR DEVICE (75) Inventors: Kenzo Hatada, Osaka (JP); Kozo Sato, Chiba (JP)

(73) Assignee: Shindo Company, Ltd., Tokyo (JP)

( * ) Notice: Subject to any disclaimer, the term of this patent is extended or adjusted under 35 U.S.C. 154(b) by 0 days.

(21) Appl. No.: 10/332,809

(22) PCT Filed: Jun. 1, 2001

(86) PCT No.: PCT/JP01/04656

§ 371 (c)(1),
(2), (4) Date: Jan. 13, 2003

(87) PCT Pub. No.: WO02/07220

PCT Pub. Date: Jan. 24, 2002

(65) Prior Publication Data

US 2004/0251536 A1 Dec. 16, 2004

(30) Foreign Application Priority Data

Jul. 19, 2000 (JP) .......................................... 2000-218815
Jul. 19, 2000 (JP) .......................................... 2000-218824

(51) Int. Cl.[7] .......................... H01L 23/02; H01L 23/48
(52) U.S. Cl. ....................... 257/686; 257/690; 257/693; 257/777
(58) Field of Search ................................ 257/685–688, 257/678, 690, 692, 693, 777

(56) References Cited

U.S. PATENT DOCUMENTS

| 5,546,279 | A | * | 8/1996 | Aota et al. | ................... | 361/749 |
| 6,239,496 | B1 | * | 5/2001 | Asada | ........................ | 257/777 |
| 6,424,031 | B1 | * | 7/2002 | Glenn | ........................ | 257/686 |

FOREIGN PATENT DOCUMENTS

| JP | 57-12754 | 1/1982 |
| JP | 2-20055 | 1/1990 |
| JP | 02-134859 | 5/1990 |
| JP | 04-085837 | 3/1992 |
| JP | 57-069765 | 4/1992 |
| JP | 05-183103 | 7/1993 |
| JP | 05-211246 | 8/1993 |
| JP | 06-216305 | 8/1994 |
| JP | 07-249725 | 9/1995 |
| JP | 08-051182 | 2/1996 |
| JP | 8-130046 | * 5/1996 |
| JP | 8-222691 | 8/1996 |
| JP | 08-306815 | 11/1996 |
| JP | 09-246454 | 9/1997 |
| JP | 11-8331 | 1/1999 |

OTHER PUBLICATIONS

International Preliminary Examination Report (PCT/IPEA/409 and PCT/IPEA/416) (translated) issued for PCT/JP01/04656.

* cited by examiner

*Primary Examiner*—T. N. Quach
(74) *Attorney, Agent, or Firm*—Smith, Gambrell & Russell, LLP (57) ABSTRACT

A semiconductor device comprising a laminate of plural insulating substrates $10_1$ to $10_4$ on which are mounted semiconductor chips (electronic parts) 12, wherein, when the lower-most insulating substrate is regarded to be a first insulating substrate $10_1$ and other insulating substrates to be second insulating substrates $10_2$ to $10_4$ among the insulating substrates that are laminated;

second electrically conducting wirings $11_2$ to $11_4$ are so provided as to protrude beyond the peripheral edges of the second insulating substrates and are folded toward the side of other surfaces of the second insulating substrates, and the thus folded second electrically conducting wirings are electrically connected to the electrically conducting wirings on the lower insulating substrates.

10 Claims, 8 Drawing Sheets

SEMICONDUCTOR DEVICE

TECHNICAL FIELD

The present invention relates to a semiconductor device comprising a laminate of plural insulating substrates on which are mounted electronic parts like such chips as ICs, capacitors, resistors or coils.

BACKGROUND ART

It is a modern trend to fabricate electronic devices in ever light weight and in ever small thicknesses and sizes yet realizing high degrees of functions, integration and high signal processing speeds. Accompanying this trend, the semiconductor devices, too, are changing their forms. Namely, the semiconductor devices used to be of such a form that the lead terminals which are electrically conducting wirings were drawn out like a gull wing from the side surfaces of the package such as QFP (quad flat package). But, now, the semiconductor devices are of such a form that the electrodes are formed by using gold bumps or the like on the lower surface of the package such as BGA (ball grid array) making it possible to strikingly decrease the areas occupied by the semiconductor devices which are mounted on a mother board.

As a semiconductor device which is smaller than the BGA, a CSP (chip size package) is now drawing attention mounting a semiconductor chip which is an electronic part on a rigid substrate that is an insulating substrate made of, for example, ceramics relying upon such a method as flip-chip-mounting.

According to the above-mentioned conventional semiconductor device, an area occupied by each semiconductor device can be decreased on the mother board by decreasing the size of the package. However, since it is a modern trend to add new functions to the electronic devices, the number of the semiconductor devices mounted on the mother board is on the increase arousing a problem that the size of the mother board must be increased to meet the demand.

In such semiconductor devices, further, not only the mother board becomes large but also the lead terminals become very long from a principal semiconductor device to other semiconductor devices accompanied by a delay in the signals, distortion of signals and an increase in the consumption of electric power, making it difficult to accomplish the desired electric performance. In media equipment in which the circuit system operates at high speeds and possesses a large capacity, in particular, a decrease in the length of the lead terminals casts an important meaning.

Despite the mother board is realized in a small size, only one semiconductor device is permitted to be mounted on a mounting region for mounting a semiconductor device on the mother board. Therefore, this rather imposes limitation on the number of the semiconductor devices that can be mounted on the mother board.

Methods of solving the above problem have heretofore been proposed in, for example, Japanese Patent Publication (Laid-open) No. 223683/1998, Japanese Utility Model Publication (Laid-open) No. 61150/1988 and Japanese Patent Publication (Laid-open) No. 106509/1995, according to which wirings, solder balls, inner leads, via holes and through holes are provided on the insulating films or on the insulating sheets on which a semiconductor chip is mounted, and the insulating films or the insulating sheets are successively laminated one upon another, and are electrically connected together through the wirings, solder balls, inner leads, via holes and through holes.

With this method, however, it is difficult to confirm by eyes the connection among the insulating films and the insulating sheets. Besides, the insulating films or the insulating sheets that are laminated must be partly or entirely sealed with a resin. Therefore, even in case the device becomes partly defective, it is not easy to repair the defective part, still leaving room for improvement.

There has further been proposed a laminated multi-chip semiconductor device as disclosed in Japanese Patent No. 3033315 according to which insulating substrates of a polyimide or the like on which an electronic part such as an IC is bonded by inner leads, are laminated, and the outer leads of the upper layer and the outer leads of the lower layer are successively and electrically connected together by the outer leads which are electrically conducting wirings extending along the peripheral edges of the thus laminated insulating substrates.

In this case, however, the insulating substrate must have a predetermined size to maintain strength at the junction portion between the inner leads of the insulating substrate and the electrodes of the electronic part. In laminating the insulating substrate, further, a spacer of a predetermined thickness must be provided on the portion of the outer leads to avoid the contact between the electronic part of the upper layer and the inner leads of the lower layer, still leaving room for improvement from the standpoint of realizing the semiconductor devices in small sizes and in decreased thicknesses.

It is therefore a first object of the present invention to provide a semiconductor device preventing the electrically conducting wirings from being folded at the time of connecting the electrically conducting wirings to the electrodes of the electronic part on each insulating substrate, decreasing the size of the insulating substrate to a required minimum limit, and decreasing the size of the package as small as possible from the standpoint of practical use.

As disclosed in Japanese Patent Publication (Laid-open) No. 14979/1995, there has also been proposed a device in which leadless chip carriers mounting semiconductor memories are successively laminated in a mounting case via an insulating sheet, and the thus laminated chip carriers are electrically connected together in a manner that the end-surface through-hole electrodes formed in the side surfaces come in contact with the signal lines in the mounting case.

This, however, is not still enough for confirming by eyes the connection among the laminated chip carriers. Besides, to connect the chip carriers together, it becomes necessary to separately provide the mounting case and the internal signal lines, resulting in an increase in the number of parts and complex constitution still leaving room for improvement.

It is therefore a second object of the present invention to provide a semiconductor device which enables the laminated insulating substrates to be easily and reliably connected together electrically as a result of easily inspecting, by eyes, the connection among the laminated semiconductor devices, and simplifying the constitution by decreasing the number of parts of the semiconductor device.

A third object is to prevent the electrically conducting wirings from being folded at the time of connecting the ends of the electrically conducting wirings to the electrodes of the electronic part.

A fourth object is to stably laminate plural insulating substrates on which the electronic part is mounted.

A fifth object is to prevent the laminated insulating substrates from collapsing previously before the electric conduction is accomplished.

A sixth object is to prevent the plural electrically conducting wirings from collapsing.

A seventh object is to easily position the plural insulating substrates in laminating these insulating substrates on which the electronic parts are mounted.

A eighth object is to withstand the concentration of stress generated among the electrically conducting wirings at the corners of the insulating substrates due to internal strain caused by heat at the time of accomplishing the electric connection.

An ninth object is to form an alignment mark for positioning without increasing the number of parts.

A tenth object is to easily form the alignment mark for positioning.

DISCLOSURE OF THE INVENTION

A first invention is concerned with a semiconductor device comprising a laminate of plural insulating substrates on which are mounted electronic parts like such chips as ICs, capacitors, resistors or coils, the plural insulating substrates being laminated one upon the other on the electronic parts mounted on the underlying insulating layers, wherein, when the lower-most insulating substrate is regarded to be a first insulating substrate and other insulating substrates to be second insulating substrates among the insulating substrates that are laminated;

second electrically conducting wirings are so provided as to protrude beyond the peripheral edges of the second insulating substrates and are folded toward the side of other surfaces of the second insulating substrates, and the thus folded second electrically conducting wirings are electrically connected to the electrically conducting wirings on the lower insulating substrates.

Thus, the electrically conducting wirings of the insulating substrates are connected along the peripheral edges of the insulating substrates, enabling the connected portions of the semiconductor device to be confirmed by eyes from the outer side, permitting the connected portions to be inspected very easily, and making it easy to reliably accomplish the electric connection among the insulating substrates. Since the connection is accomplished on the side surfaces of the laminated insulating substrates, the device can be easily repaired even in case the laminated insulating substrates become partly defective. Further, the electrically conducting wirings for connection are formed protruding beyond the side surfaces of the insulating substrates, and can be connected at one time through a simple step of dipping with solder or reflowing of solder, making it possible to realize a module at a decreased cost.

Further, since the plural insulating substrates are laminated one upon the other on the electronic parts mounted on the underlying insulating layers, stability is improved in laminating the plural insulated substrates.

Second and third inventions are concerned with a semiconductor device comprising a laminate of plural insulating substrates on which are mounted electronic parts like such chips as ICs, capacitors, resistors or coils, the plural insulating substrates being laminated one upon the other on the electronic parts mounted on the underlying insulating layers, wherein, when the lower-most insulating substrate or the upper-most insulating substrate is regarded to be a first insulating substrate and other insulating substrates to be second insulating substrates among the insulating substrates that are laminated, the semiconductor device further comprises.

second electrically conducting wirings that are protruding beyond the peripheral edges of the second insulating substrates and are folded in a predetermined shape; and first electrically conducting wirings that are protruding beyond the peripheral edges of the first insulating substrate and are extending up to the upper-most insulating substrate or to the lower-most insulating substrate;

wherein the first electrically conducting wirings are electrically connected to the second electrically conducting wirings.

Thus, the electrically conducting wirings among the insulating substrates are connected along the peripheral edges of the insulating substrates, enabling the connected portions to be confirmed by eyes from the outer side, permitting the connected portions to be inspected very easily, and making it easy to reliably accomplish the electric connection among the insulating substrates. Further, the electrically conducting wirings among the insulating substrates are connected along the peripheral edges of the laminated insulating substrates by the electrically conducting wirings protruding beyond the peripheral edges of the lower-most or the upper-most insulating substrate and are extending without using any additional part for connection, yet enabling the connected portions of the semiconductor device to be confirmed by eyes from the outer side, permitting the connected portions to be inspected very easily, and making it easy to reliably accomplish the electric connection among the insulating substrates. Moreover, since the connection is accomplished on the side surfaces of the laminated insulating substrates, the device can be easily repaired even in case the laminated insulating substrates become partly defective. Further, the electrically conducting wirings for connection are formed protruding beyond the side surfaces of the insulating substrates, and can be reliably connected at one time through a simple step of dipping with solder or reflowing of solder, making it possible to realize a module at a decreased cost.

Further, since the plural insulating substrates are laminated one upon the other on the electronic parts mounted on the underlying insulating layers, stability is improved in laminating the plural insulated substrates.

In the semiconductor devices of the above first to third inventions, further, it is desired to interpose an adhesive among the insulating substrate and the electronic parts. This prevents the plural insulating substrates that are laminated from collapsing before accomplishing the electric connection, in addition to obtaining the effects of the above first to third inventions.

In the semiconductor devices of the above first to third inventions, further, it is desired that the first and second electrically conducting wirings are arranged in a plural number on their respective insulating substrates and that a collapse-preventing member is provided at the tips of the second electrically conducting wirings to bundle the second electrically conducting wirings. This prevents the electrically conducting wirings from collapsing and secures the electrically conducting wirings so as to maintain a predetermined precise pitch in addition to obtaining the effects of the first to third inventions.

In the semiconductor devices of the above first to third inventions, further, it is desired that positioning protrusions are provided at the corners of the insulating substrates for positioning in laminating the insulating substrates. This facilitates the positioning in laminating the insulating substrates up and down by using the protrusions maintaining high precision in position in addition to obtaining the effects of the first to third inventions. The protrusions further serve as a reference outer shape in molding the mounted device with a resin, enabling the resin to be correctly molded. Besides, the protrusions protruding beyond the electrically conducting wirings among the laminated insulating substrates prevent previously the electrically conducting wirings from receiving external force, from being deformed or from being damaged.

In the semiconductor devices of the above first to third inventions, further, it is desired that the electrically conducting wirings at the ends are formed wider than the other electrically conducting wirings. This prevents the destruction that occurs when stress is exerted on the electrically conducting wirings due to a difference in the expansion between the electronic part and the insulating substrate and improves reliability in the connection in addition to obtaining the effects of the first to third inventions.

It is desired to form an alignment mark for positioning on the wide electrically conducting wirings. This makes it possible to accomplish the positioning relying upon optical means by using the alignment mark in laminating the plural insulating substrates and to more easily align the positions among the upper and lower insulating substrates in addition to obtaining the effects of the first to third inventions. Further, the alignment marks can be easily formed at one time in other steps if the alignment marks are round holes.

BEST MODE FOR CARRYING OUT THE INVENTION

An embodiment of the invention will now be described with reference to the drawings.

Figure 1:
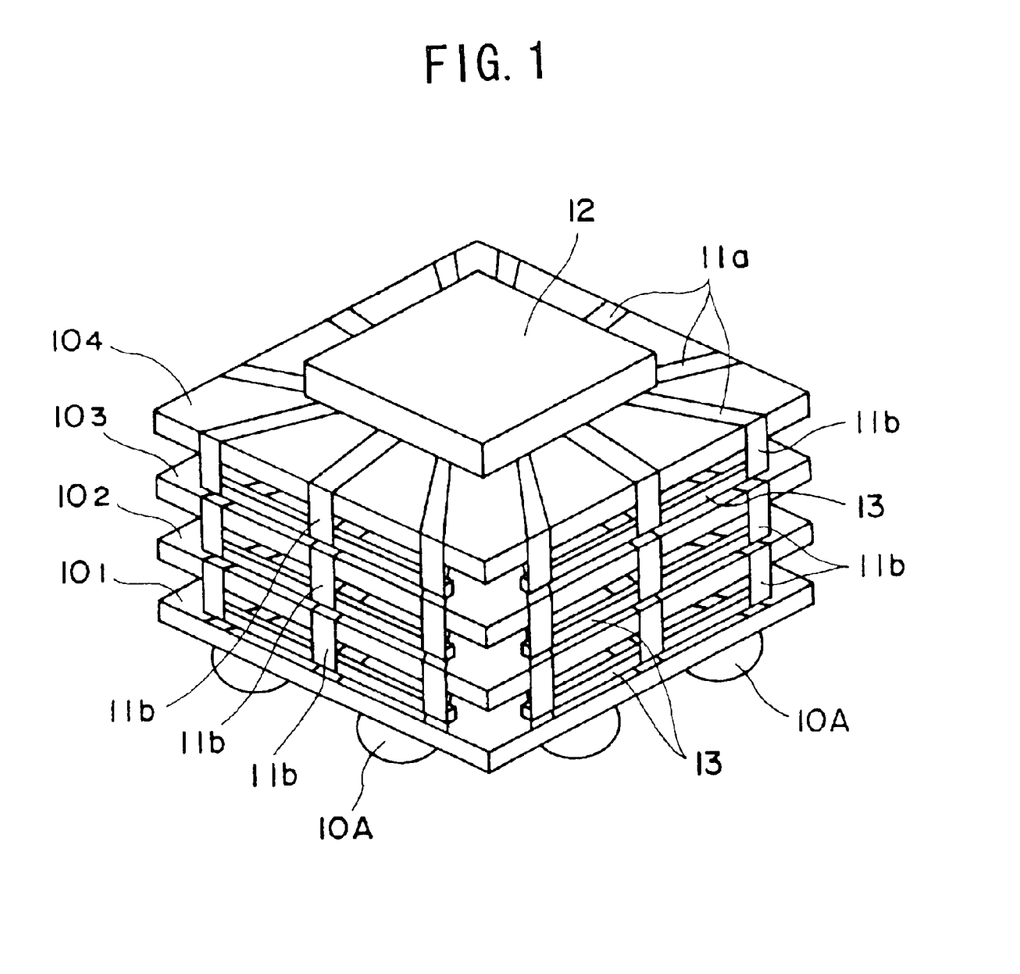
FIG. 1 is a perspective view schematically illustrating a semiconductor device according to the present invention.
Figure 2:
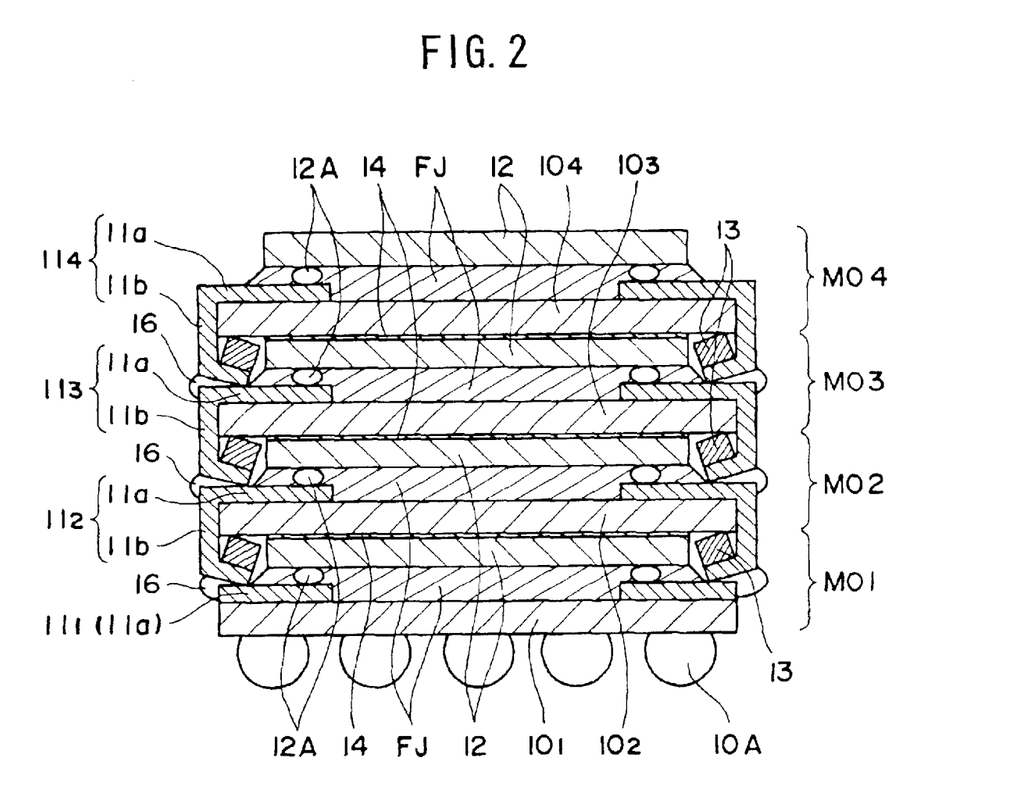
FIG. 2 is a vertical sectional view of the semiconductor device.

FIG. 1 illustrates the appearance of a semiconductor device according to the invention. FIG. 2 is a vertical sectional view thereof.

The semiconductor device that is shown includes four modules MO1 to MO4 that are laminated one upon another. The modules MO1 to MO4 have plural insulating substrates $10_1$ to $10_4$, electrically conducting wirings $11_1$ to $11_4$, semiconductor chip (electronic part) 12 and a sealing resin FJ.

In the module MO1 of the lower-most layer, first electrically conducting wirings $11_1$ are arranged in a plural number on one surface of the first insulating substrate $10_1$ made of a glass epoxy or a polyimide.

In other modules MO2 to MO4, second electrically conducting wirings $11_2$ to $11_4$ are arranged in a plural number on the second insulating substrate $10_2$ to $10_4$ which are, similarly, made of the glass epoxy or the polyimide The second electrically conducting wirings $11_2$ to $11_4$ have their ends $11a$ on one side formed on the surfaces on one side of the second insulating substrates $10_2$ to $10_4$ and have their ends $11b$ on the other side protruding beyond the peripheral edges of the second insulating substrates $10_2$ to $10_4$.

Figure 3:
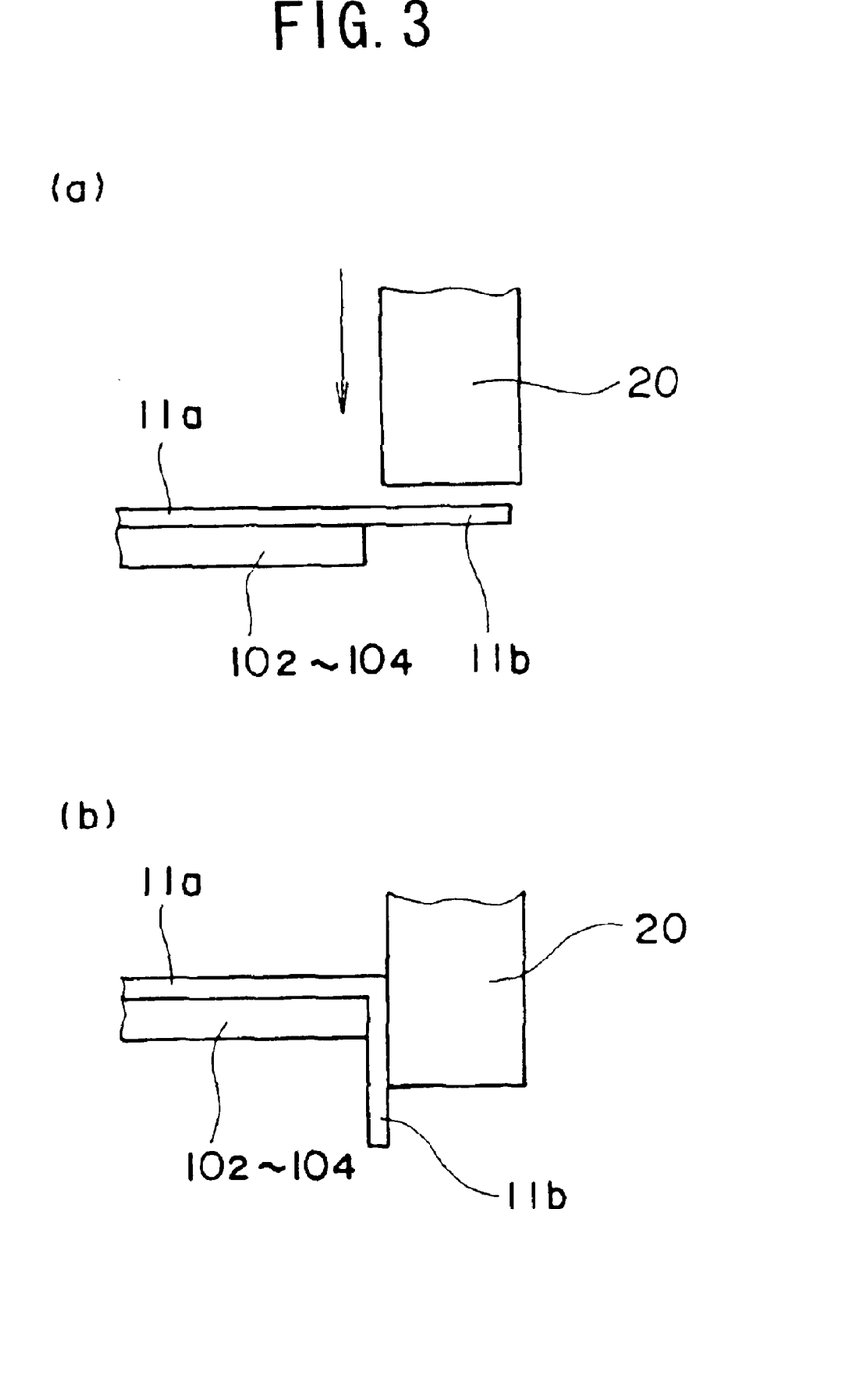
FIG. 3 is a sectional view schematically illustrating procedure for folding the electrically conducting wiring protruded beyond the insulating substrate by using a jig, wherein FIG. 3($a$) is a view of before folded and FIG. 3($b$) is a view of after folded.

The ends $11b$ on the other side that are protruding are, for example, folded toward the surfaces of the other side of the second insulating substrates $10_2$ to $10_4$ as shown in FIG. 3($b$) by moving a jig 20 in the direction of an arrow in FIG. 3($a$).

In this embodiment, the ends on the other side $11b$ are folded nearly at right angles. By folding the ends in a curved manner, however, the electrically conducting wirings $11_2$ to $11_4$ can be prevented from being damaged or broken caused by cracks that stem from the stress of when the ends $11b$ on the other side are folded.

In this embodiment as shown in FIGS. 1 and 2, collapse-preventing members 13 are provided for the tips of the ends $11b$ on the other side of the second electrically conducting wirings $11_2$ to $11_4$, the collapse-preventing members 13 being made, for example, of the same material as the insulating substrates to bundle the second electrically conducting wirings $11_2$ to $11_4$ so as to be held maintaining a predetermined pitch.

On the insulating substrates $10_1$ to $10_4$, the electrodes 12A of the semiconductor chips 12 are connected to the ends $11a$ on one side of the electrically conducting wirings $11_1$ to $11_4$; i.e., the semiconductor chips 12 such as ICs or LSIs are mounted by a flip-chip-mounting method or a TAB system.

Here, the insulating substrates 10 and the semiconductor chips 12 have thicknesses of from several tens of $\mu$m to several hundreds of $\mu$m. The semiconductor chips 12 are polished on their back surfaces without forming element in their form of wafers or chips by a mechanical polishing method such as grinding or polishing, by a chemical polishing method such as dissolving with an etching solution comprising chiefly an HF solution, or by a CMP (chemical mechanical polishing) method which is a combination of the above methods, so as to possess desired thicknesses.

The electrically conducting wirings $11_1$ to $11_4$ on the insulating substrates $10_1$ to $10_4$ need not necessarily have the same wiring patterns. When, for example, the semiconductor chips 12 that are mounted are not the same, different wiring constitutions are employed, as a matter of course, to cope with the electrodes 12A of the semiconductor chips 12 which are not the same.

Here, a sealing resin FJ of an insulating material is poured onto the insulating substrates $10_1$ to $10_4$ on which the semiconductor chips 12 are mounted as described above. This seals the junction portions between the ends $11a$ on one side of the electrically conducting wirings $11_1$ to $11_4$ and the electrodes 12A of the semiconductor chips 12.

The insulating substrates $10_2$ to $10_4$ of the upper modules MO2 to MO4 are placed on the semiconductor chips 12 of the modules MO1 to MO3 via an adhesive 14. The folded ends $11b$ on the other side of the electrically conducting wirings $11_2$ to $11_4$ of the upper layers are successively connected to the surfaces of the ends $11a$ on one side of the electrically conducting wirings $11_1$ to $11_3$ of the lower layers by soldering, by using an electrically conducting paste or by welding.

For example, a solder material is disposed on the ends of the electrically conducting wirings $11_2$ to $11_4$, and is caused to reflow, so that the folded electrically conducting wirings $11_2$ to $11_4$ come in contact with the electrically conducting wirings $11_1$ to $11_3$ on the insulating substrates $10_1$ to $10_3$ which are the lower layers. By melting the solder 16 as shown in FIG. 2, the connection is easily accomplished.

Further, the solder may be melted in a solder jar equipped with a heater, and the laminated modules MO1 to MO4 may be immersed in the molten solder to accomplish the connection.

In the step of immersion in the solder melted in the solder jar, the short-circuiting among the electrically conducting wirings $11_2$ to $11_4$ connected among the insulating substrates 10 can be prevented if an angle θ subtended by at least one corner of the semiconductor device which is a hexahedron and the surface of the molten solder is selected to be from 30° to 60° C. in pulling up the semiconductor device from the molten solder.

Here, on the other surface of the first insulating substrate $10_1$ which is the lower-most module MO1 of the semiconductor device, there are formed, in a predetermined pattern, electrodes 10A for external connection to connect electrically to the mother board. In the embodiment of FIGS. 1 and 2, the electrodes 10A are formed of solder balls which are of the so-called CSP (chip size package) or the BGA (ball grid array) structure.

Figure 4:
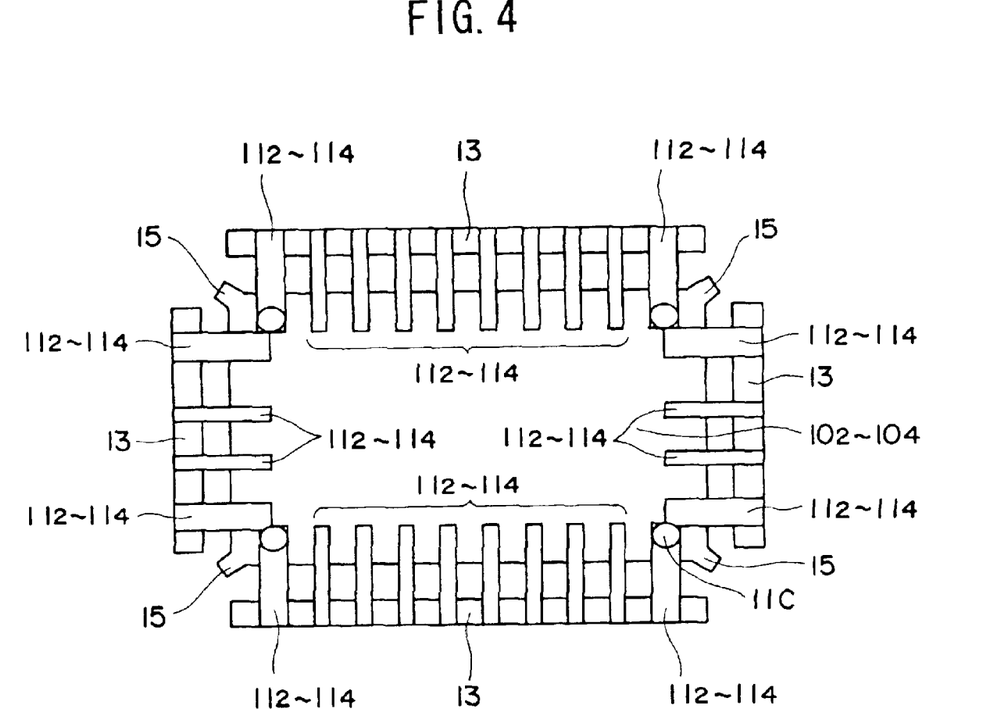
FIG. 4 is a plan view of an insulating substrate having protrusions formed at four corners thereof and on which the electrically conducting wirings formed at the corners are wider than the other electrically conducting wirings.

In the semiconductor device of this embodiment as shown in FIG. 4, further, positioning protrusions 15 are provided at four corners of the insulating substrates $10_1$ to $10_4$ for laminating the insulating substrates $10_1$ to $10_4$, so as to the protrusions 15 protruding beyond the size of the outer shape of the insulating substrates $10_1$ to $10_4$.

Thus, the positioning protrusions 15 are for positioning the insulating substrates $10_1$ to $10_4$ that are being laminated, and facilitate the positioning in laminating the insulating substrates $10_1$ to $10_4$.

Not only facilitating the positioning, the positioning protrusions 15 that are provided on the outer sides of the electrically conducting wirings $11_1$ to $11_4$ work to prevent previously the electrically conducting wirings $11_2$ to $11_4$ folded from the peripheral edges of the insulating substrates $10_2$ to $10_4$ from coming in contact with the external parts and to prevent previously the electrically conducting wirings $11_2$ to $11_4$ from being damaged during the operation.

In the semiconductor device as shown in FIG. 4, further, among the electrically conducting wirings $11_1$ to $11_4$ arranged in a plural number on the insulating substrates $10_1$ to $10_4$, the electrically conducting wirings $11_1$ to $11_4$ positioned at least at the ends (closest to the corners) are formed wider than the other electrically conducting wirings $11_1$ to $11_4$ positioned on the inside.

Therefore, even when stress is concentrated in the electrically conducting wirings $11_1$ to $11_4$ due to a difference in the expansion between the semiconductor chips 12 and the insulating substrates $10_1$ to $10_4$, the electrically conducting wirings $11_1$ to $11_4$ are prevented from being broken and a high degree of reliability is accomplished. The widths of the electrically conducting wirings $11_1$ to $11_4$ at the ends may vary depending on the size of the insulating substrates $10_1$ to $10_4$ and the environmental conditions. Here, however, it is desired that the electrically conducting wirings $11_1$ to $11_4$ at the ends are wider by more than 1.2 times than the widths of the electrically conducting wirings $11_1$ to $11_4$ of the inside.

In the semiconductor device of the embodiment as shown in FIG. 4, a round hole is formed in the wide electrically conducting wirings $11_1$ to $11_4$ to form alignment marks 11C for positioning. Upon forming the alignment marks 11C for positioning, the plural insulating substrates $10_1$ to $10_4$ that are being laminated can be positioned by optical means utilizing the alignment marks 11C, enabling the upper and lower insulating substrates $10_1$ to $10_4$ to be more easily positioned. The alignment marks 11C which are round holes can be easily formed by perforation in other step of fabrication.

In the above-mentioned embodiment, the second electrically conducting wirings $11_2$ to $11_4$ of the insulating substrates $10_2$ to $10_4$ were electrically connected to the electrically conducting wirings $11_1$ to $11_3$ of the insulating substrates $10_1$ to $10_3$ of the lower modules MO1 to MO3. It is, however, also allowable to employ the constitution shown in FIGS. 5 and 6.

Figure 5:
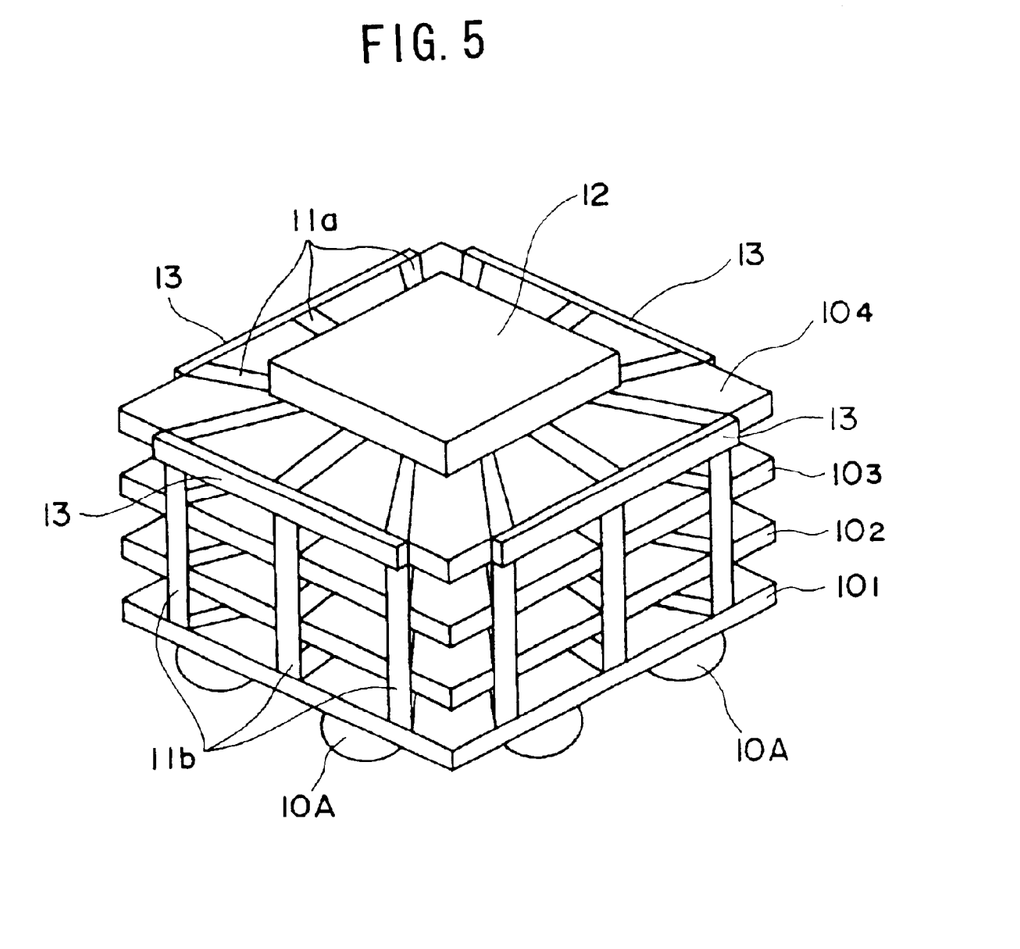
FIG. 5 is a perspective view schematically illustrating the semiconductor device according to another embodiment of the present invention.
Figure 6:
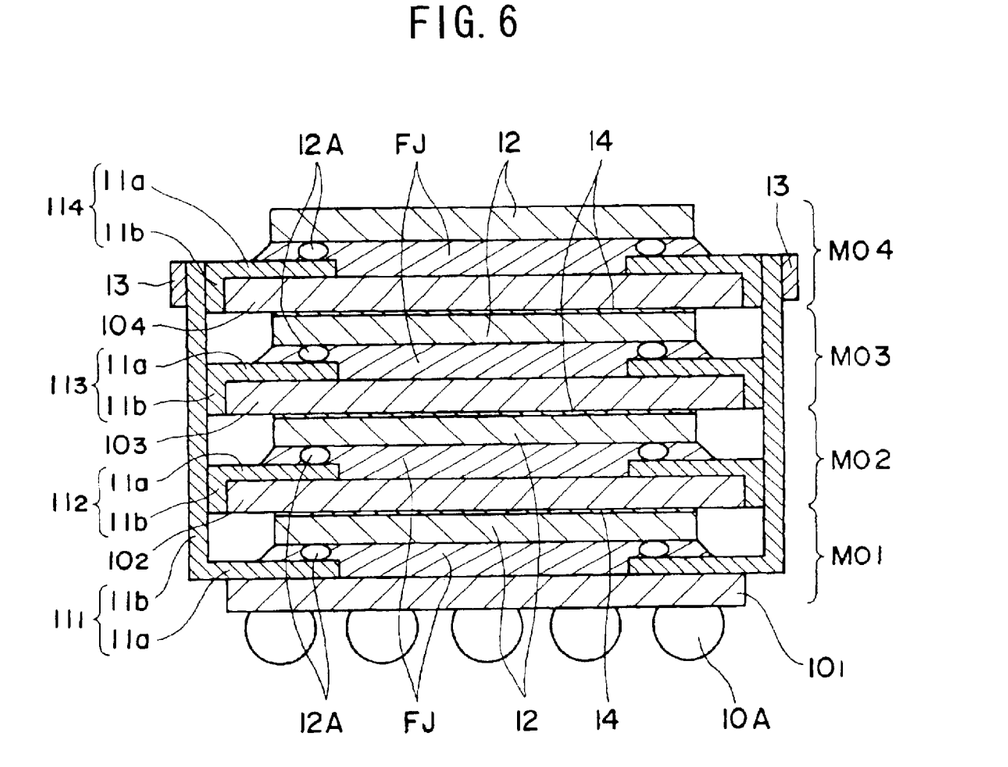
FIG. 6 is a vertical sectional view of the semiconductor device.

In the semiconductor device shown in FIGS. 5 and 6, plural modules MO1 to MO4 are similarly laminated successively, the modules MO1 to MO4 being provided with plural insulating substrates $10_1$ to $10_4$, electrically conducting wirings $11_1$ to $11_4$, semiconductor chips (electronic parts) 12, and the sealing resin FJ.

Figure 7:
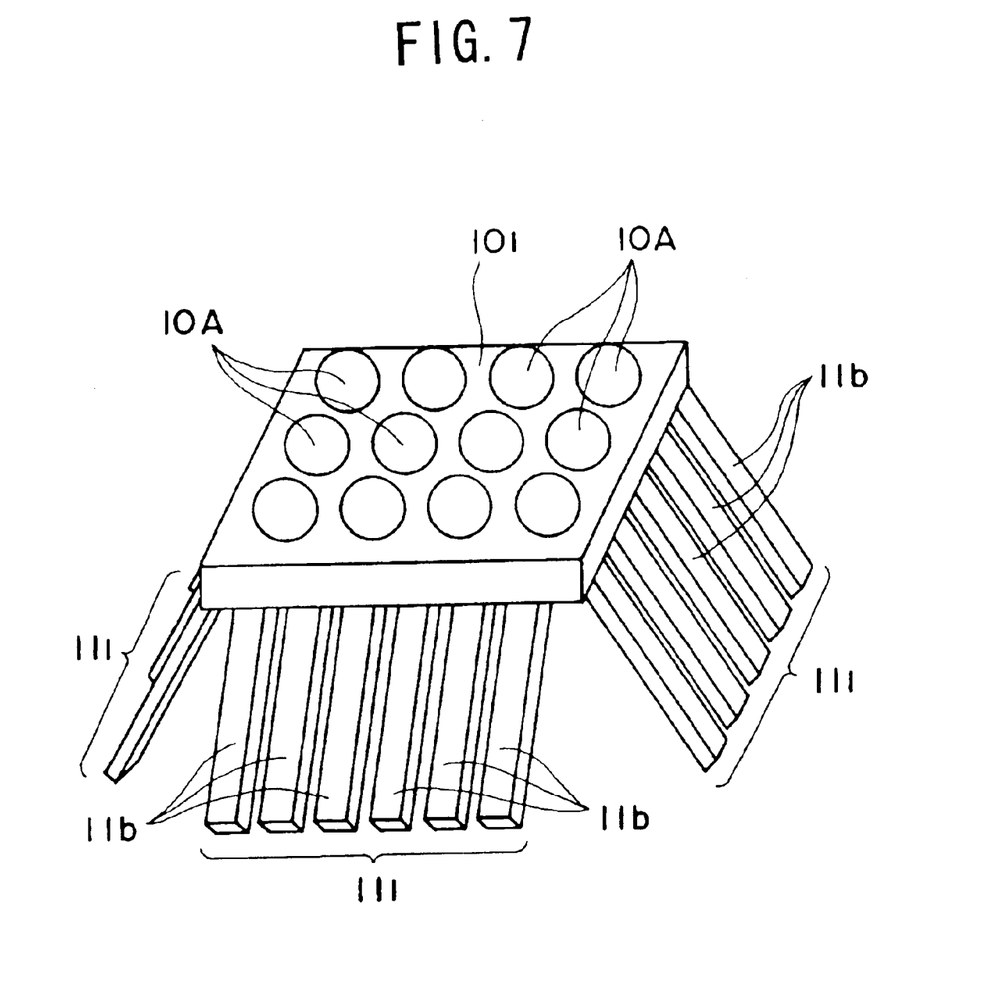
FIG. 7 is a perspective view schematically illustrating a module of the lower-most layer.

As also shown in FIG. 7, the lower-most module MO1 has plural first electrically conducting wirings $11_1$ arranged on the first insulating substrate $10_1$. The first electrically conducting wirings $11_1$ have ends 11a on one side formed on one surface of the first insulating substrate $10_1$ and have ends 11b on the other side that protrude beyond the peripheral edges of the first insulating substrate $10_1$ and are folded upward to extend up to the upper-most insulating substrate $10_4$.

Other modules MO2 to MO4 have the second electrically conducting wirings $11_2$ to $11_4$ arranged in a plural number on the second insulating substrates $10_2$ to $10_4$. The second electrically conducting wirings $11_2$ to $11_4$ have ends 11a on one side formed on the surfaces on one side of the second insulating substrates $10_2$ to $10_4$ and have ends 11b on the other side that protrude beyond the peripheral edges of the second insulating substrates $10_2$ to $10_4$ and are folded in a predetermined shape to run along, for example, the end surfaces of the second insulating substrates $10_2$ to $10_4$.

The upwardly folded ends 11b on the other side of the first upwardly folded electrically conducting wirings $11_1$ are successively connected electrically to the ends 11b on the other side of the second electrically conducting wirings $11_2$ to $11_4$.

In the diagramed embodiment, collapse-preventing members 13 are provided for the tips of the ends 11b on the other side of the first electrically conducting wirings $11_1$ to bundle the first electrically conducting wirings $11_1$ and to secure the first electrically conducting wirings $11_1$ so as to maintain a predetermined pitch, the collapse-preventing members 13 being made, for example, of the same material as the insulating substrates.

In the semiconductor device shown in FIGS. 5 and 6, among the insulating substrates $10_1$ to $10_4$ that are laminated, the lower-most one is regarded to be the first insulating substrate $10_1$, the other ones are regarded to be the second insulating substrates $10_2$ to $10_4$, the ends 11b on the other side of the first electrically conducting wirings $11_1$ arranged on the first insulating substrate $10_1$ are protruded beyond the peripheral edges of the first insulating substrate $10_1$, are folded upward to extend up to the upper-most insulating substrate $10_4$, and are successively connected electrically to the ends 11b on the other side of the second electrically conducting wirings $11_2$ to $11_4$.

Figure 8:
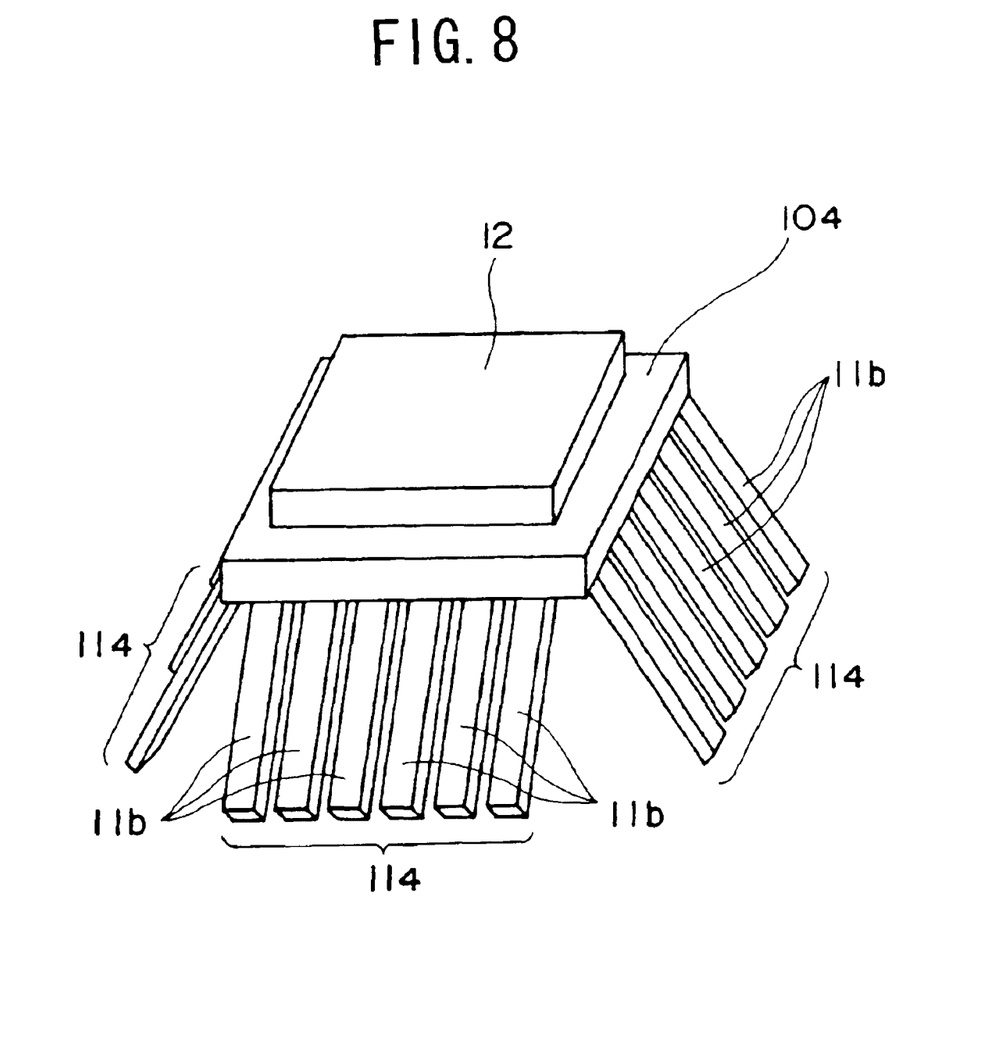
FIG. 8 is a perspective view schematically illustrating a module of the upper-most layer used in the other embodiment.

It is, however, as shown in FIG. 8, also allowable to so regard that, among the insulating substrates $10_1$ to $10_4$ that are laminated, the upper-most one is the first insulating substrate $10_4$, the other ones are the second insulating substrates $10_1$ to $10_3$, and the ends 11b on the other side of the first electrically conducting wirings $11_4$ arranged on the first insulating substrate $10_4$ are protruded beyond the peripheral edges of the first insulating substrate $10_4$, and are folded downward to extend up to the lower-most insulating substrate $10_1$ so as to be successively connected electrically to the ends 11b on the other side of the second electrically conducting wirings $11_1$ to $11_3$.

INDUSTRIAL APPLICABILITY

A module is formed by mounting an electronic part like such a chip as an IC, a capacitor, a resistor or a coil on an insulating substrate. The modules are, then, laminated one upon another to fabricate a semiconductor device which is installed on, for example, a mother board and is connected thereto so as to be utilized being mounted on electronic equipment.

What is claimed is:

1. A semiconductor device comprising:

a laminate of plural insulating substrates;

electronic parts mounted on the plural insulating substrates such that the substrates are laminated upon the electronic parts mounted on an underlying substrate; and electrically conductive wirings wherein, where the lower-most insulating substrate is regarded to be a first insulating substrate and other insulating substrates to be second insulating substrates, the second insulating substrates have the electrically conducting wirings so as to protrude beyond peripheral edges of the second insulating substrates and fold downward along a side surface of the second insulating substrates to electrically connect to electrically conducting wirings on a lower insulating substrate.

2. A semiconductor device comprising:

a laminate of plural insulating substrates;

electronic parts mounted on the plural insulating substrates such that the substrates are laminated upon the electronic parts mounted on an underlying substrate; and electronically conductive wirings, wherein, when the lower-most insulating substrate is regarded to be a first insulating substrate and other insulating substrates to be second insulating substrates, the electrically conductive wirings include second electrically conducting wirings that protrude beyond peripheral edges of the second insulating substrates and that are folded in a predetermined shape, and first electrically conducting wirings that protrude beyond peripheral edges of the first insulating substrate and that extend up to an upper-most one of the second insulating substrates, and wherein first electrically conducting wirings are electrically connected to the second electrically conducting wirings.

3. A semiconductor device comprising:

a laminate of plural insulating substrates;

electronic parts, mounted on the plural insulating substrates such that the substrates are laminated upon the electronic parts mounted on an underlying substrate; and electrically conductive wirings, wherein, when the upper-most insulating substrate is regarded to be a first insulating substrate and other insulating substrates to be second insulating substrates the electrically conductive wirings include second wirings that protrude beyond peripheral edges of the second insulating substrates and that are folded in a predetermined shape, and first electrically conducting wirings that protrudes beyond peripheral edges of the first insulating substrate and extend up to a lower-most one of the second insulating substrates, and wherein the first electrically conducting wirings are electrically connected to the second electrically conducting wirings.

4. A semiconductor device according to claim 1, 2 or 3, wherein said electronic parts are flip-chip-mounted on surfaces on one side of each of the insulating substrates.

5. A semiconductor device according to claim 1, 2 or 3, wherein neighboring insulating substrates and their electronic parts are arranged via an adhesive.

6. A semiconductor device according to claim 1, 2 or 3, wherein the electrically conducting wirings are arranged in a plural number on their respective insulating substrates, and collapse-preventing members are provided at tips of the electrically conducting wirings to bundle the wirings.

7. A semiconductor device according to claim 1, 2 or 3, wherein positioning protrusions are provided at corner of the insulating substrates for positioning in laminating the substrates.

8. A semiconductor device according to claim 1, 2 or 3, wherein among the electrically conducting wirings arranged in a plural number, ends thereof are formed wider than other electrically conducting wirings.

9. A semiconductor device according to claim 8, wherein an alignment mark for positioning is formed on said wide electrically conducting wirings.

10. A semiconductor device according to claim 9, wherein said alignment mark is a round hole.

* * * * *